United States Patent
Endo et al.

(10) Patent No.: US 12,072,629 B2
(45) Date of Patent: *Aug. 27, 2024

(54) RESIST UNDERLAYER FILM-FORMING COMPOSITION CONTAINING NOVOLAC RESIN TO WHICH AROMATIC VINYL COMPOUND IS ADDED

(71) Applicant: NISSAN CHEMICAL INDUSTRIES, LTD., Tokyo (JP)

(72) Inventors: Takafumi Endo, Toyama (JP); Keisuke Hashimoto, Toyama (JP); Hirokazu Nishimaki, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/127,889

(22) PCT Filed: Mar. 17, 2015

(86) PCT No.: PCT/JP2015/057900
§ 371 (c)(1),
(2) Date: Sep. 21, 2016

(87) PCT Pub. No.: WO2015/151803
PCT Pub. Date: Oct. 8, 2015

(65) Prior Publication Data
US 2017/0097568 A1    Apr. 6, 2017

(30) Foreign Application Priority Data

Mar. 31, 2014    (JP) .................... 2014-072734

(51) Int. Cl.
G03F 7/11    (2006.01)
C08G 14/02    (2006.01)
(Continued)

(52) U.S. Cl.
CPC ............ G03F 7/11 (2013.01); C08G 14/02 (2013.01); C09D 161/34 (2013.01); G03F 7/091 (2013.01);
(Continued)

(58) Field of Classification Search
CPC ......... C09D 161/34; G03F 7/091; G03F 7/32; G03F 7/094; G03F 7/162; G03F 7/11;
(Continued)

(56) References Cited

U.S. PATENT DOCUMENTS 2,859,205 A * 11/1958 Lection .................... C08G 8/30
525/503
3,538,051 A * 11/1970 Higginbottom .......... C08G 8/10
525/139
(Continued)

FOREIGN PATENT DOCUMENTS

JP    H01-154050 A    6/1989
JP    H02-22657 A    1/1990
(Continued)

OTHER PUBLICATIONS

Mori et al., "Investigation of new crosslinking system for phenolic resin", J. Network Poly. Jn., vol. 18(4) pp. 190-200 (1997).*
(Continued)

*Primary Examiner* — Martin J Angebranndt
(74) *Attorney, Agent, or Firm* — Oliff PLC

(57) ABSTRACT

A resist underlayer film-forming composition has high solubility in a solvent used at a lithography process for exhibiting good coating film forming properties and able to decrease a sublime generated during formation of a film. A resist underlayer film-forming composition having a novolac resin having a structure group (C) obtained by a reaction of an aromatic ring structure of an aromatic ring-containing compound (A) with a vinyl group of an aromatic vinyl compound (B). The aromatic vinyl compound (B) is represented by Formula (1), and is specifically styrene, 2-vinylnaphthalene, 4-tert-butylstyrene, or 4-tert-butoxystyrene.

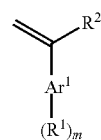

Formula (1)

The structure group (C) is represented by Formula (2).

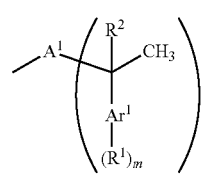

Formula (2)

The aromatic ring-containing compound (A) is an aromatic amine compound or a phenolic hydroxy group-containing compound. The novolac resin is a resin produced by a reaction of the aromatic amine compound or the phenolic hydroxy group-containing compound with aldehyde or ketone.

12 Claims, No Drawings

(51) Int. Cl.
- *C09D 161/34* (2006.01)
- *G03F 7/09* (2006.01)
- *G03F 7/16* (2006.01)
- *G03F 7/20* (2006.01)
- *G03F 7/32* (2006.01)
- *G03F 7/34* (2006.01)
- *H01L 21/027* (2006.01)
- *H01L 21/033* (2006.01)

(52) U.S. Cl.
CPC .............. *G03F 7/094* (2013.01); *G03F 7/16* (2013.01); *G03F 7/20* (2013.01); *G03F 7/32* (2013.01); *H01L 21/0276* (2013.01); *H01L 21/0337* (2013.01); *H01L 21/0332* (2013.01)

(58) Field of Classification Search
CPC .. G03F 7/20; G03F 7/16; C08G 14/02; C08G 8/28; C08G 8/30; H01L 21/027; H01L 21/0332; H01L 21/0337; C08L 51/08; C08L 21/00; C08L 7/00; C08L 2666/04; C08L 2666/02; C08L 2666/16; C08L 9/00; C08L 61/14; C08F 283/00; C08F 283/06; C08F 212/08
See application file for complete search history.

(56) References Cited

U.S. PATENT DOCUMENTS

| | | | | |
|---|---|---|---|---|
| 4,200,706 | A * | 4/1980 | Starks | C08K 5/01 525/502 |
| 5,021,522 | A * | 6/1991 | Durairaj | C08G 8/20 428/495 |
| 5,049,641 | A * | 9/1991 | Hood | C08G 8/20 528/153 |
| 5,521,260 | A * | 5/1996 | Futaesaku | C08F 283/00 525/480 |
| 6,242,533 | B1 * | 6/2001 | Kurimoto | C08G 8/24 525/132 |
| 7,378,217 | B2 | 5/2008 | Oh et al. | |
| 8,993,215 | B2 * | 3/2015 | Nishimaki | G03F 7/091 430/270.1 |
| 9,263,286 | B2 * | 2/2016 | Sakamoto | C08G 12/08 |
| 9,469,777 | B2 * | 10/2016 | Endo | C08G 8/02 |
| 11,650,505 | B2 * | 5/2023 | Nishimaki | G03F 7/162 438/703 |
| 2006/0199924 | A1 * | 9/2006 | Banach | C08F 283/00 525/502 |
| 2010/0151381 | A1 * | 6/2010 | Tachibana | C09D 133/16 430/270.1 |
| 2012/0077345 | A1 * | 3/2012 | Saito | C08G 12/26 438/703 |
| 2012/0184103 | A1 * | 7/2012 | Ogihara | G03F 7/094 438/703 |
| 2014/0235059 | A1 * | 8/2014 | Sakamoto | C08G 12/08 438/702 |
| 2015/0044876 | A1 * | 2/2015 | Nishimaki | G03F 7/091 438/703 |
| 2015/0316850 | A1 * | 11/2015 | Someya | G03F 7/091 438/703 |
| 2016/0139509 | A1 * | 5/2016 | Hashimoto | C09D 161/06 438/703 |
| 2016/0147151 | A1 * | 5/2016 | Shinjo | C08G 12/26 438/694 |
| 2017/0227850 | A1 * | 8/2017 | Nishimaki | G03F 7/11 |

FOREIGN PATENT DOCUMENTS

| | | | | |
|---|---|---|---|---|
| JP | H02-293850 | A | 12/1990 | |
| JP | 2004-250479 | * | 9/2004 | ............. G03F 7/039 |
| JP | 2004250479 | A * | 9/2004 | |
| JP | 2005-114921 | * | 4/2005 | ................ G03F 7/11 |
| JP | 2005-128509 | A | 5/2005 | |
| JP | 2006-259249 | A | 9/2006 | |
| JP | 2007-178974 | A | 7/2007 | |
| JP | 2007-199653 | A | 8/2007 | |
| JP | 2009-229666 | A | 10/2009 | |
| WO | 2007/105776 | A1 | 9/2007 | |
| WO | 2010/147155 | A1 | 12/2010 | |
| WO | 2013/047516 | A1 | 4/2013 | |
| WO | 2013/146670 | A1 | 10/2013 | |
| WO | 2014/030579 | * | 2/2014 | ............. G03F 7/26 |

OTHER PUBLICATIONS

Jun. 2, 2015 Written Opinion issued in International Patent Application No. PCT/JP2015/057900.
Jun. 2, 2015 International Search Report issued in International Patent Application No. PCT/JP2015/057900.

\* cited by examiner

US 12,072,629 B2

RESIST UNDERLAYER FILM-FORMING COMPOSITION CONTAINING NOVOLAC RESIN TO WHICH AROMATIC VINYL COMPOUND IS ADDED

TECHNICAL FIELD

The present invention relates to a resist underlayer film-forming composition for lithography effective in processing of a semiconductor substrate, a method for forming a resist pattern using the resist underlayer film-forming composition, and a method for producing a semiconductor device.

BACKGROUND ART

Conventionally, in production of a semiconductor device, microprocessing by lithography using a photoresist composition has been carried out. The microprocessing is a processing method in which a thin film of the photoresist composition is formed on a substrate to be processed, such as a silicon wafer, irradiated with active light such as ultraviolet light through a mask pattern that has a pattern of the semiconductor device, and developed, and the substrate to be processed, such as a silicon wafer, is etched using the obtained photoresist pattern as a protective film. In recent years, however, an increase in degree of integration of the semiconductor device has advanced, the wavelength of active light used has been shortened from a KrF excimer laser (248 nm) to an ArF excimer laser (193 nm). For this reason, diffuse reflection of active light on the substrate and effects of standing wave have become severe problems. A method for providing an anti-reflective coating (Bottom Anti-Reflective Coating, BARC) between the photoresist and the substrate to be processed has been widely applied. For further microprocessing, a lithography technique using extreme ultraviolet light (EUV, 13.5 mm) or electron beam (EB) as active light has also been developed. In EUV lithography and EB lithography, since diffuse reflection on the substrate and standing wave do not generally occur, a specific anti-reflective coating is not required. However, a resist underlayer film has started to be widely investigated as an auxiliary film for improving resolution and adhesion of a resist pattern.

As miniaturization of the resist pattern advances, a decrease in film thickness of a resist becomes essential. This is because a decrease in resolution and collapse of a resist pattern to be formed due to the miniaturization are likely to occur. As a result, it is difficult to maintain a resist pattern film thickness necessary for substrate processing. Thus, it is necessary that a function of a mask during the substrate processing is imparted not only to the resist pattern but also to the resist underlayer film that is formed between the resist and the semiconductor substrate to be processed. For a decrease in film thickness of such a resist, at least two layers of resist underlayer film are formed, and a lithography process using the resist underlayer film as an etching mask is adopted. For such a thin film resist, a process in which the resist pattern is transferred to an underlayer film thereof by an etching process, and a substrate is processed using the underlayer film as a mask, or a process in which the resist pattern is transferred to an underlayer film thereof by an etching process, and a step of transferring the pattern transferred to the underlayer film to another underlayer film thereof using a different etching gas is repeated, and a substrate is finally processed is adopted. In this case, the resist underlayer film for the lithography process is required to have high etching resistance to an etching gas (e.g., fluorocarbon) at a dry etching step.

Examples of a polymer for the resist underlayer film include as follows.

Resist underlayer film-forming compositions using polyvinyl carbazole are exemplified (see Patent Documents 1, 2, and 3).

Resist underlayer film-forming compositions using fluorene phenol novolac resin are described (see Patent Document 4).

Resist underlayer film-forming compositions using fluorene naphthol novolac resin are described (see Patent Document 5).

Resist underlayer film-forming compositions containing a resin having fluorene phenol and arylalkylene as repeating units are described (see Patent Documents 6 and 7).

Resist underlayer film-forming compositions using a carbazole novolac resin are described (see Patent Document 8).

Resist underlayer film-forming compositions using polynuclear phenol novolac are described (see Patent Document 9).

PRIOR ART DOCUMENTS

Patent Documents

Patent Document 1: Japanese Patent Application Publication No. H2-293850 (JP H2-293850 A)
Patent Document 2: Japanese Patent Application Publication No. H1-154050 (JP H1-154050 A)
Patent Document 3: Japanese Patent Application Publication No. H2-22657 (JP H2-22657 A)
Patent Document 4: Japanese Patent Application Publication No. 2005-128509 (JP 2005-128509 A)
Patent Document 5: Japanese Patent Application Publication No. 2007-199653 (JP 2007-199653 A)
Patent Document 6: Japanese Patent Application Publication No. 2007-178974 (JP 2007-178974 A)
Patent Document 7: U.S. Pat. No. 7,378,217
Patent Document 8: International Publication WO2010/147155 Pamphlet
Patent Document 9: Japanese Patent Application Publication No. 2006-259249 (JP 2006-259249 A)

SUMMARY OF THE INVENTION

Problem to be Solved by the Invention

It is desirable that the resist underlayer film-forming composition be applied to a silicon wafer using a spin coater to form a film, as in the case of a resist composition, from the viewpoints of productivity and economy. However, in order to achieve good coating properties in such a coating-type resist underlayer film-forming composition, it is necessary that a polymer resin as a main component of the resist underlayer film-forming composition, a crosslinker, a crosslinking catalyst, and the like be dissolved in an appropriate solvent. Typical examples of such a solvent include propylene glycol monomethyl ether (PGME), propylene glycol monomethyl ether acetate (PGMEA), and cyclohexanone that are used in a resist-forming composition. It is necessary that the resist underlayer film-forming composition have good solubility in the solvents.

At a baking step of forming a resist underlayer film from the resist underlayer film-forming composition, there is a new problem in which a sublimating component (sublimate) derived from the polymer resin or a low molecular compound such as the crosslinker and the cross-linking catalyst is generated. When such a sublimate is attached to and deposited in a film-forming device at a step of producing a semiconductor device, the inside of the film-forming device may be contaminated. When such a sublimate is attached to a wafer as a foreign substance, a defect and the like may be caused. Therefore, such a resist underlayer film-forming composition that the sublimate generated from the resist underlayer film at the baking step is suppressed is required.

The present invention is made in order to solve the problems. An object of the present invention is to provide a resist underlayer film-forming composition that has high solubility in a resist solvent (solvent used at a lithography process) for exhibiting good coating film forming properties and is capable of decreasing a sublimate that is generated during formation of a film, a method for forming a resist pattern using the resist underlayer film-forming composition, and a method for producing a semiconductor device.

Means for Solving the Problems

The present invention provides: as a first aspect, a resist underlayer film-forming composition comprising a novolac resin having a structure group (C) as an additional group that is obtained by a reaction of an aromatic ring structure of an aromatic ring-containing compound (A) with a vinyl group of an aromatic vinyl compound (B);

as a second aspect, the resist underlayer film-forming composition according to the first aspect, wherein the aromatic ring structure of the aromatic ring-containing compound (A) is an aromatic ring-containing structure constituting a polymer chain of the novolac resin;

as a third aspect, the resist underlayer film-forming composition according to the first or second aspect, wherein the aromatic vinyl compound (B) is represented by Formula (1):

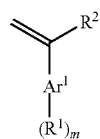

Formula (1)

(In Formula (1), $Ar^1$ is a $C_{6-40}$ aryl group, $R^1$ is a $C_{1-10}$ alkyl group, a $C_{2-10}$ alkenyl group, a $C_{2-10}$ alkynyl group, a $C_{6-40}$ aryl group, a hydroxyl group, a cyano group, a nitro group, an amino group, a carboxyl group, an acetyl group, a hydroxymethyl group, a halogenomethyl group, a —Y—Z group, a halogen atom, or a combination of these, Y is an oxygen atom, a sulfur atom, a carbonyl group, or an ester group, Z is a $C_{1-10}$ alkyl group, $R^2$ is a hydrogen atom, a methyl group, or a phenyl group, and m is an integer of 0 to (5+2n), wherein n is the condensation degree of an aromatic ring constituting the aryl group as defined by $Ar^1$.);

as a fourth aspect, the resist underlayer film-forming composition according to any one of the first to third aspects, wherein the aromatic vinyl compound (B) is styrene, 2-vinylnaphthalene, 4-tert-butylstyrene, or 4-tert-butoxystyrene;

as a fifth aspect, the resist underlayer film-forming composition according to any one of the first to fourth aspects, wherein the structure group (C) is represented by Formula (2):

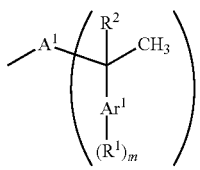

Formula (2)

(In Formula (2), $Ar^1$, $R^1$, $R^2$, and m have the same definition as in Formula (1), and $A^1$ is a group derived from the aromatic ring structure of the aromatic ring-containing compound (A), and particularly a group derived from the aromatic ring-containing structure constituting the polymer chain of the novolac resin);

as a sixth aspect, the resist underlayer film-forming composition according to any one of the first to fifth aspects, wherein the aromatic ring-containing compound (A) is an aromatic amine compound or a phenolic hydroxy group-containing compound;

as a seventh aspect, the resist underlayer film-forming composition according to any one of the first to sixth aspects, wherein the novolac resin is a resin produced by a reaction of an aromatic amine compound or a phenolic hydroxy group-containing compound with aldehyde or ketone;

as an eight aspect, the resist underlayer film-forming composition according to the seventh aspect, wherein the aromatic amine compound is phenylindole or phenylnaphthylamine;

as a ninth aspect, the resist underlayer film-forming composition according to the seventh aspect, wherein the phenolic hydroxy group-containing compound is phenol, dihydroxybenzene, trihydroxybenzene, hydroxynaphtalene, dihydroxynaphtalene, trihydroxynaphtalene, tris(4-hydroxyphenyl)methane, tris(4-hydroxyphenyl)ethane, or 1,1,2,2-tetrakis(4-hydroxyphenyl)ethane;

as a tenth aspect, the resist underlayer film-forming composition according to any one of the seventh to ninth aspects, wherein aldehyde is naphthaldehyde or pyrenecarboxyaldehyde;

as an eleventh aspect, the resist underlayer film-forming composition according to any one of the first to tenth aspects, further comprising a solvent;

as a twelfth aspect, the resist underlayer film-forming composition according to any one of the first to eleventh aspects, further comprising an acid and/or an acid generator;

as a thirteenth aspect, the resist underlayer film-forming composition according to any one of the first to twelfth aspects, further comprising a crosslinker;

as a fourteenth aspect, a method for forming a resist pattern used in production of a semiconductor comprising a step of applying the resist underlayer film-forming composition according to any one of the first to thirteenth aspects to a semiconductor substrate and baking the composition to form an underlayer film;

as a fifteenth aspect, a method for producing a semiconductor device comprising steps of forming an underlayer film on a semiconductor substrate from the resist underlayer film-forming composition according to any one of the first to thirteenth aspects, forming a resist film on the underlayer film, forming a resist pattern by irradiation with light or electron beam and development, etching the underlayer film through the formed resist pattern, and processing the semiconductor substrate through the patterned underlayer film;

as a sixteenth aspect, a method for producing a semiconductor device comprising steps of forming an underlayer film on a semiconductor substrate from the resist underlayer film-forming composition according to any one of the first to thirteenth aspects, forming a hard mask on the underlayer film, forming a resist film on the hard mask, forming a resist pattern by irradiation with light or electron beam and development, etching the hard mask through the formed resist pattern, etching the underlayer film through the patterned hard mask, and processing the semiconductor substrate through the patterned underlayer film; and as a seventeenth aspect, the method according to the sixteenth aspect, wherein the hard mask is formed by vapor deposition of an inorganic substance.

Effects of the Invention

The resist underlayer film-forming composition of the present invention is a coating-type composition that has a high solubility in a resist solvent and excellent spin coating properties. A resist underlayer film obtained from the resist underlayer film-forming composition of the present invention is not dissolved again in the resist solvent after coating and baking. Further, at a step of baking the resist underlayer film-forming composition to form a film, the generation of a sublimating component (sublimate) derived from a polymer resin or a low molecular compound such as a crosslinker and a cross-linking catalyst can be decreased.

MODES FOR CARRYING OUT THE INVENTION

The present invention is a resist underlayer film-forming composition comprising a novolac resin having a structure group (C) as an additional group that is obtained by a reaction of an aromatic ring structure of an aromatic ring-containing compound (A) with a vinyl group of an aromatic vinyl compound (B).

In the present invention, the resist underlayer film-forming composition for lithography contains the resin and a solvent. The composition may contain a crosslinker, an acid, an acid generator, a surfactant, or the like, if necessary.

The solid content of the composition is 0.1 to 70% by mass, or 0.1 to 60% by mass. The solid content is a content ratio of all components other than the solvent relative to the resist underlayer film-forming composition. The solid content may contain the polymer in an amount of 1 to 100% by mass, 1 to 99.9% by mass, 50 to 99.9% by mass, 50 to 95% by mass, or 50 to 90% by mass.

The polymer (resin) used in the present invention has a weight average molecular weight of 600 to 1,000,000, or 600 to 200,000.

Examples of the aromatic vinyl compound (B) include vinyl group-containing compounds having a structure of Formula (1).

In Formula (1), $Ar^1$ is a $C_{6-40}$ aryl group, and $R^1$ is a $C_{1-10}$ alkyl group, a $C_{2-10}$ alkenyl group, a $C_{2-10}$ alkynyl group, a $C_{6-40}$ aryl group, a hydroxy group, a cyano group, a nitro group, an amino group, a carboxyl group, an acetyl group, a hydroxymethyl group, a halogenomethyl group, a —Y—Z group, a halogen atom, or a combination thereof. Y is an oxygen atom, a sulfur atom, a carbonyl group, or an ester group, Z is a $C_{1-10}$ alkyl group. $R^2$ is a hydrogen atom, a methyl group, or a phenyl group, and preferably a hydrogen atom. m is an integer of 0 to (5+2n), wherein n is the condensation degree of a benzene ring of the aryl group derived from $Ar^1$.

Examples of the $C_{1-10}$ alkyl group herein include methyl group, ethyl group, n-propyl group, isopropyl group, cyclopropyl group, n-butyl group, isobutyl group, sec-butyl group, tert-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-isopropyl-cyclopropyl group, 2-isopropyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

Examples of the $C_{6-40}$ aryl group include phenyl group, o-methylphenyl group, m-methylphenyl group, p-methylphenyl group, o-chlorophenyl group, m-chlorophenyl group, p-chlorophenyl group, o-fluorophenyl group, p-fluorophenyl group, o-methoxyphenyl group, p-methoxyphenyl group, p-nitrophenyl group, p-cyanophenyl group, α-naphthyl group, β-naphthyl group, o-biphenylyl group, m-biphenylyl group, p-biphenylyl group, 1-anthryl group, 2-anthryl group, 9-anthryl group, 1-phenanthryl group, 2-phenanthryl group, 3-phenanthryl group, 4-phenanthryl group, and 9-phenanthryl group.

Examples of the $C_{2-10}$ alkenyl group include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-isopropylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-sec-butylethenyl group, 1,3-dimethyl-1-butenyl group, 1,3-dimethyl-2-butenyl group, 1,3-dimethyl-3-butenyl group, 1-isobutylethenyl group, 2,2-dimethyl-3-butenyl group, 2,3-dimethyl-1-butenyl group, 2,3-dimethyl-2-butenyl group, 2,3-dimethyl-3-butenyl group, 2-isopropyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-tert-butylethenyl group, 1-methyl-1-ethyl-2-propenyl group, 1-ethyl-2-methyl-1-propenyl group, 1-ethyl-2-methyl-2-propenyl group, 1-isopropyl-1-propenyl group, 1-isopropyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and 3-cyclohexenyl group.

Examples of the $C_{2-10}$ alkynyl group include ethynyl group and propargyl group.

In the —Y—Z group, Y is an oxygen atom, a sulfur atom, a carbonyl group, or an ester group, and Z is a $C_{1-10}$ alkyl group. Specifically, the groups described in the aforementioned examples are exemplified. Examples of the halogen atom and an atom constituting a halogeno group contained in a halogenomethyl group include a fluorine atom, a chlorine atom, a bromine atom, and an iodine atom.

Examples of the aromatic vinyl compound (B) having a structure of Formula (1) include, for example, as follows.

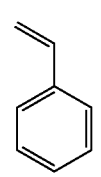

Formula (3-1)

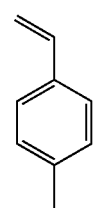

Formula (3-2)

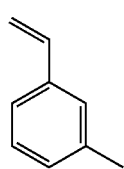

Formula (3-3)

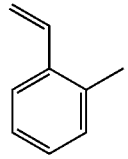

Formula (3-4)

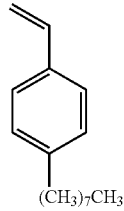

Formula (3-5)

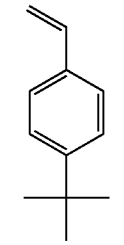

Formula (3-6)

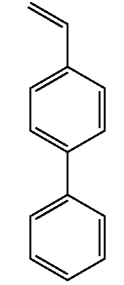

Formula (3-7)

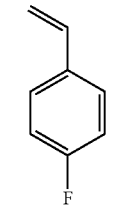

Formula (3-8)

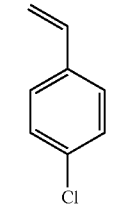

Formula (3-9)

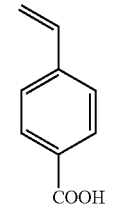

Formula (3-10)

-continued
Formula (3-11)
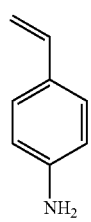
Formula (3-12)
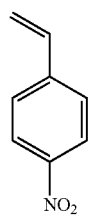
Formula (3-13)
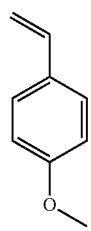
Formula (3-14)
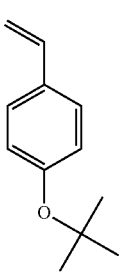
Formula (3-15)
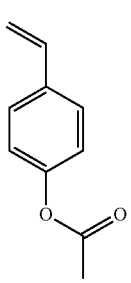
Formula (3-16)
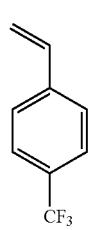
Formula (3-17)
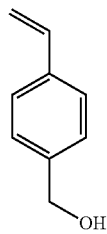
Formula (3-18)
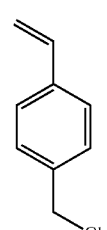
Formula (3-19)
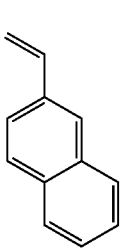
Formula (3-20)
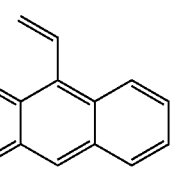
Formula (3-21)
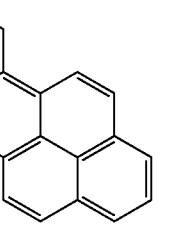
Formula (3-22)
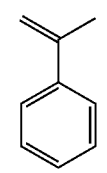
Formula (3-23)
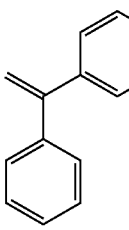
It is preferable that the aromatic vinyl compound (B) be styrene, 2-vinylnaphthalene, 4-tert-butylstyrene, or 4-tert-butoxystyrene.

Examples of the aromatic ring-containing compound (A), that is, an organic compound containing an aromatic ring include aromatic amine compounds and phenolic hydroxy group-containing compounds.

It is preferable that the aromatic amine compound be $C_{6-40}$ amine. Examples thereof include aniline, naphthylamine, phenylnaphthylamine, phenylindole, and carbazole. Phenylnaphthylamine or phenylindole can be suitably used.

Examples of the phenolic hydroxy group-containing compound include $C_{6-40}$ compounds, and specific examples thereof include phenol, dihydroxybenzene, trihydroxybenzene, hydroxynaphtalene, dihydroxynaphtalene, trihydroxynaphtalene, tris(4-hydroxyphenyl)methane, tris(4-hydroxyphenyl)ethane, and 1,1,2,2-tetrakis(4-hydroxyphenyl)ethane.

Examples of a structure group (C) obtained by a reaction of the aromatic ring structure of the aromatic ring-containing compound (A) with the vinyl group of the aromatic vinyl compound (B) include resins having the structure of Formula (2).

In Formula (2), $Ar^1$, $R^1$, $R^2$, and m have the same definition as in Formula (1), that is, $Ar^1$ is a $C_{6-40}$ aryl group, and $R^1$ is a $C_{1-10}$ alkyl group, a $C_{2-10}$ alkenyl group, a $C_{2-10}$ alkynyl group, a $C_{6-40}$ aryl group, a hydroxyl group, a cyano group, a nitro group, an amino group, a carboxyl group, an acetyl group, a hydroxymethyl group, a halogenomethyl group, a —Y—Z group, a halogen atom, or a combination thereof, Y is an oxygen atom, a sulfur atom, a carbonyl group, or an ester group, Z is a $C_{1-10}$ alkyl group, $R^2$ is a hydrogen atom, a methyl group, or a phenyl group. m is an integer of 0 to (5+2n), wherein n is the condensation degree of an aromatic ring constituting the aryl group as defined by $Ar^1$.

In Formula (2), $A^1$ is a group derived from the aromatic ring structure of the aromatic ring-containing compound (A), and particularly a group derived from the aromatic ring-containing structure constituting the polymer chain of the novolac resin.

It is preferable that the reaction of the aromatic ring structure of the aromatic ring-containing compound (A) with the vinyl group of the aromatic vinyl compound (B) be a reaction of the compound (A) with the compound (B) at a molar ratio of 1:0.1 to 8.0, or 1:0.1 to 4.0.

The aromatic ring structure of the preferred aromatic ring-containing compound (A) is an aromatic ring-containing structure constituting the polymer chain of the novolac resin.

The novolac resin is obtained, for example, from arbitrary aldehyde or ketone that can react with an organic compound containing an aromatic ring, that is, the aromatic ring-containing compound (A).

Therefore the novolac resin is a resin produced by a reaction of an aromatic amine compound or a phenolic hydroxy group-containing compound with aldehyde or ketone.

Examples of the aromatic amine compound include phenylindole and phenylnaphthylamine.

Examples of the phenolic hydroxy group-containing compound include phenol, dihydroxybenzene, trihydroxybenzene, hydroxynaphtalene, dihydroxynaphtalene, trihydroxynaphtalene, tris(4-hydroxyphenyl)methane, tris(4-hydroxyphenyl)ethane, and 1,1,2,2-tetrakis(4-hydroxyphenyl)ethane.

Examples of the aldehyde or ketone include $C_{6-40}$ aldehydes or ketones, and specific examples thereof include benzaldehyde, naphthaldehyde, phenylbenzaldehyde, and pyrenecarboxaldehyde. Naphthaldehyde and pyrenecarboxaldehyde are preferred.

A condensation reaction of producing the novolac and an additional reaction with the vinyl group of the aromatic vinyl compound (B) can progress simultaneously. As an acid catalyst used in these reactions, a mineral acid such as sulfuric acid, phosphoric acid, and perchloric acid, an organic sulfonic acid such as p-toluenesulfonic acid, p-toluenesulfonic acid monohydrate, and methane sulfonic acid, or a carboxylic acid such as formic acid and oxalic acid is used. The amount of acid catalyst to be used is variously selected depending on the acid used. The amount is usually 0.001 to 10,000 parts by mass, preferably 0.01 to 1,000 parts by mass, and more preferably 0.1 to 100 parts by mass, relative to 100 parts by mass of the aromatic ring-containing compound (A).

The condensation reaction and the addition reaction are also carried out without solvent, but are usually carried out using a solvent. Any solvent can be used as long as it does not inhibit the reactions. Examples of the solvent include ethers such as 1,2-dimethoxyethane, diethyleneglycol dimethyl ether, propylene glycol monomethyl ether, tetrahydrofuran, and dioxane. When the acid catalyst used is, for example, a liquid like formic acid, it can also act as the solvent.

The reaction temperature during condensation is usually 40° C. to 200° C. The reaction time is variously selected depending on the reaction temperature, and is usually about 30 minutes to about 50 hours.

The weight average molecular weight Mw of the polymer obtained as described above is usually 500 to 1,000,000 or 600 to 200,000.

Typical examples of the novolac resin having the structure group (C) as an additional group that is obtained by a reaction of the aromatic ring structure of the aromatic ring-containing compound (A) with the vinyl group of the aromatic vinyl compound (B) include as follows.

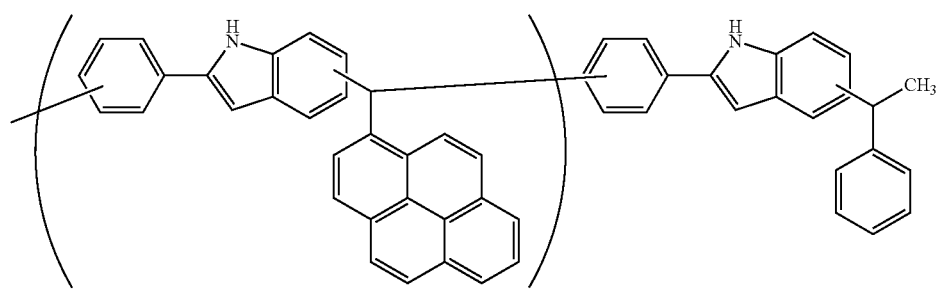
Formula (4-1)
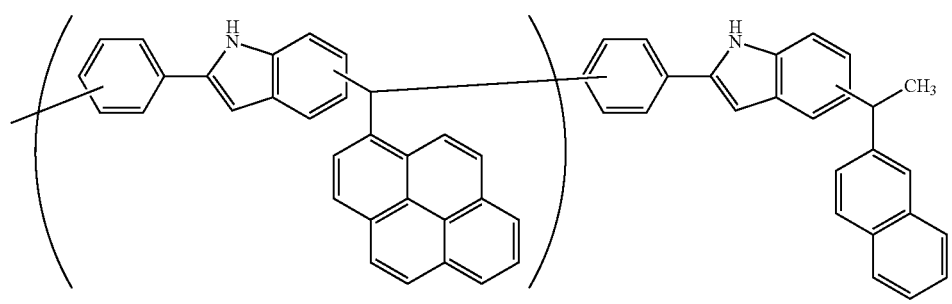
Formula (4-2)
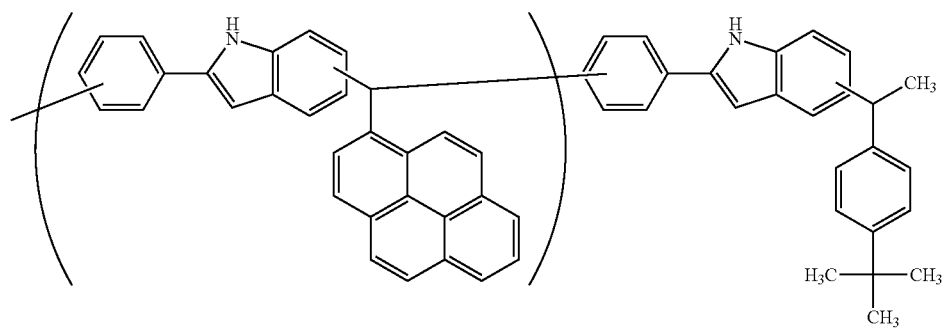
Formula (4-3)
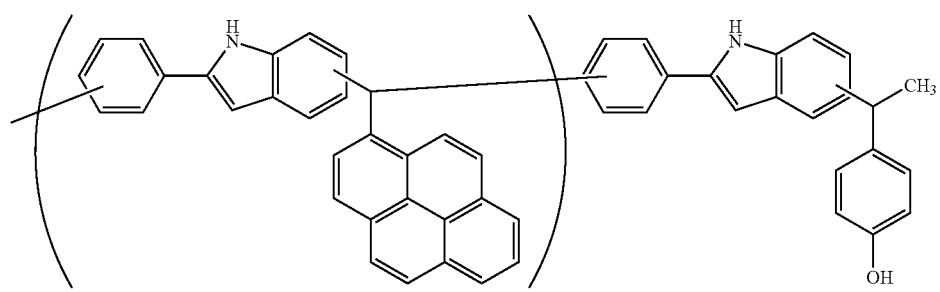
Formula (4-4)
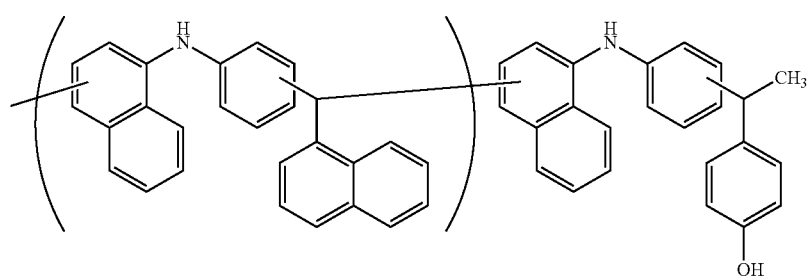
Formula (4-5)

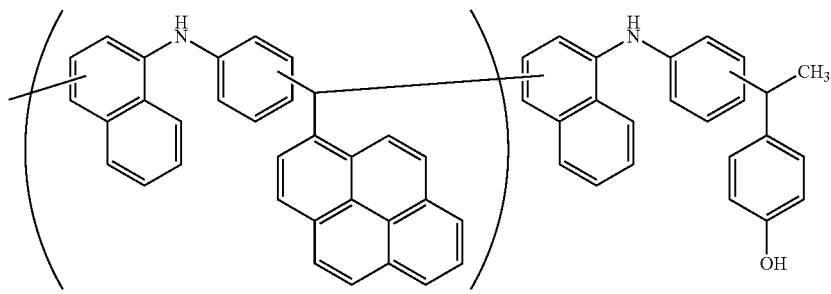
Formula (4-6)

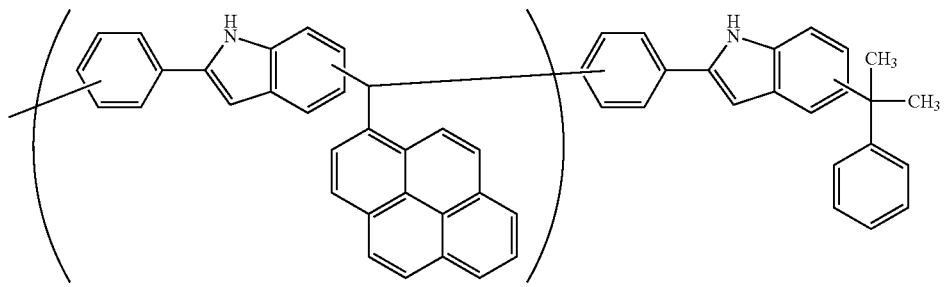
Formula (4-7)

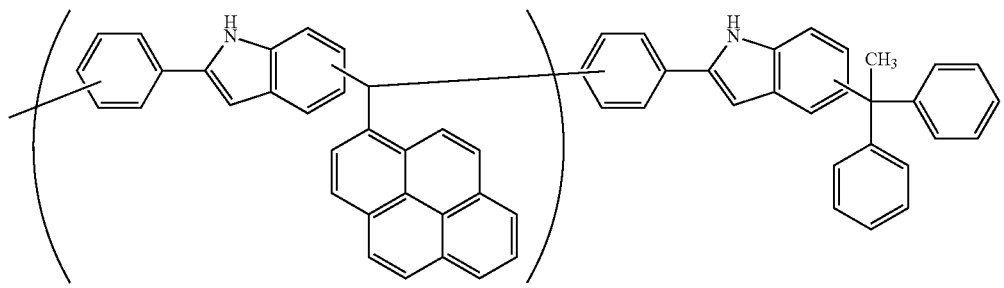
Formula (4-8)

The resist underlayer film-forming composition of the present invention may contain a crosslinker component. Examples of the crosslinker include melamine-based compounds, substituted urea-based compounds, and polymers thereof. A crosslinker having at least two crosslink-forming substituents is preferred. Examples thereof include methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, and methoxymethylated thiourea. A condensate thereof may be also used.

As the crosslinker, a crosslinker having high heat resistance may be used. As the crosslinker having high heat resistance, a compound containing a crosslink-forming substituent having an aromatic ring (e.g., benzene ring and naphthalene ring) in the molecule may be preferably used.

Examples of the compound include a compound having a substructure of the following Formula (5), and a polymer and an oligomer having a repeating unit of the following Formula (6).

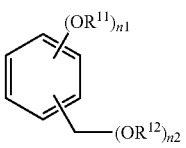
Formula (5)

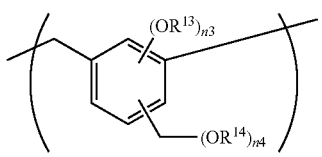
Formula (6)

In the aforementioned Formulae, $R^{11}$, $R^{12}$, $R^{13}$, and $R^{14}$ are each independently a hydrogen atom or a $C_{1-10}$ alkyl group, and as the alkyl group, the aforementioned examples may be used. In the aforementioned Formulae, n1 is an integer of 1 to 2, n2 is an integer of 1 to (6-n1), n3 is an integer of 1 to 2, and n4 is an integer of 0 to (4-n3).

Examples of the compounds of Formula (5) and the polymers and oligomers of Formula (6) include the following Formulae (7-1) to (7-27). In the following Formulae, Me is a methyl group.

Formula (7-1)

Formula (7-2)

Formula (7-3)

Formula (7-4)

Formula (7-5)

Formula (7-6)

Formula (7-7)

Formula (7-8)

Formula (7-9)

Formula (7-10)

Formula (7-11)

Formula (7-12)

Formula (7-13)

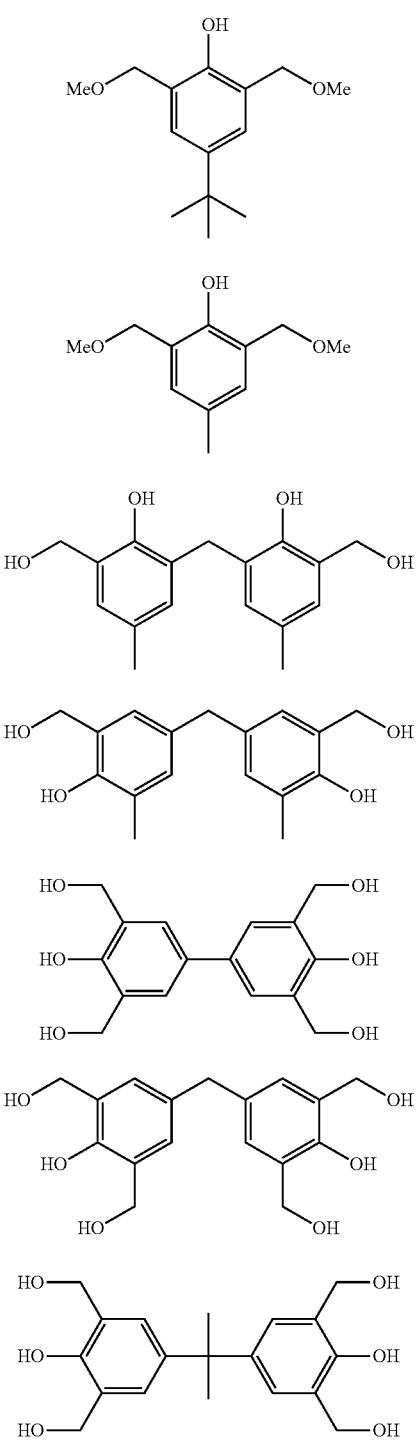
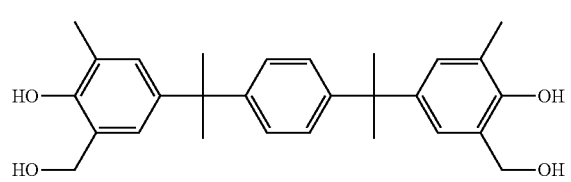

The compounds are available as products from Asahi Organic Chemicals Industry Co., Ltd., and Honshu Chemical Industry Co., Ltd. Among the crosslinkers, for example, the compound of Formula (7-24) is available as trade name TM-BIP-A from Asahi Organic Chemicals Industry Co., Ltd.

The amount of crosslinker to be added varies depending on a coating solvent to be used, an underlying substrate to be used, a solution viscosity to be required, and a film form to be required. The amount is 0.001 to 80% by mass, preferably 0.01 to 50% by mass, and more preferably 0.05 to 40% by mass, relative to the total solid content. The crosslinker may cause a cross-linking reaction due to self-condensation. However, when the polymer of the present invention has a crosslinkable substituent, the crosslinker may cause a cross-linking reaction with the crosslinkable substituent.

In the present invention, as a catalyst for promoting the cross-linking reaction, an acid and/or an acid generator may be added. For example, an acidic compound such as p-toluenesulfonic acid, trifluoromethanesulfonic acid, pyridinium p-toluenesulfonic acid, salicylic acid, 5-sulfosalicylic acid, 4-phenolsulfonic acid, camphorsulfonic acid, 4-chlorobenzenesulfonic acid, benzenedisulfonic acid, 1-naphthalenesulfonic acid, citric acid, benzoic acid, hydroxybenzoic acid, and naphthalenecarboxylic acid, and/or a thermal acid generator such as 2,4,4,6-tetrabromocyclohexadienone, benzoin tosylate, 2-nitrobenzyl tosylate, and another organic alkyl sulfonic acid may be mixed. The amount to be mixed is 0.0001 to 20% by mass, preferably 0.0005 to 10% by mass, and more preferably 0.01 to 3% by mass, relative to the total solid content.

The resist underlayer film-forming composition for lithography of the present invention may contain a photoacid generator in order to match the acidity of the composition with the acidity of a photoresist covering the composition as the upper layer at a lithography process. Preferable examples of the photoacid generator include onium salt-based photoacid generators such as bis(4-tert-butylphenyl)iodonium trifluoromethanesulfonate and triphenylsulfonium trifluoromethanesulfonate, halogen-containing compound-based photoacid generators such as phenyl-bis(trichloromethyl)-s-triazine, and sulfonic acid-based photoacid generators such as benzoin tosylate and N-hydroxysuccinimide trifluoromethanesulfonate. The amount of the photoacid generator is 0.2 to 10% by mass, and preferably 0.4 to 5% by mass, relative to the total solid content.

In addition, the resist underlayer film-forming composition for lithography of the present invention may contain a light absorber, a rheology controlling agent, an adhesive adjuvant, a surfactant, or the like, if necessary.

As the light absorber, a commercially available light absorber described in "Kogyoyoshikiso no gijutsu to shijo (Technology and market of industrial colorant)" (CMC Publishing Co., Ltd.) or "Senryo binran (Dye handbook)" (edited by The Society of Synthetic Organic Chemistry, Japan), for example, C. I. Disperse Yellow 1, 3, 4, 5, 7, 8, 13, 23, 31, 49, 50, 51, 54, 60, 64, 66, 68, 79, 82, 88, 90, 93, 102, 114, or 124; C. I. Disperse Orange 1, 5, 13, 25, 29, 30, 31, 44, 57, 72, or 73; C. I. Disperse Red 1, 5, 7, 13, 17, 19, 43, 50, 54, 58, 65, 72, 73, 88, 117, 137, 143, 199, or 210; C. I. Disperse Violet 43; C. I. Disperse Blue 96; C. I. Fluorescent Brightening Agent 112, 135, or 163; C. I. Solvent Orange 2, or 45; C. I. Solvent Red 1, 3, 8, 23, 24, 25, 27, or 49; C. I. Pigment Green 10; C. I. Pigment Brown 2, or the like can be suitably used. The light absorber is usually mixed in an amount of 10% by mass or less, and preferably 5% by mass or less, relative to the total solid content of the resist underlayer film-forming composition for lithography.

The rheology controlling agent is added to mainly improve the flow behavior of the resist underlayer film-forming composition, and in particular, to improve the film thickness uniformity of the resist underlayer film and enhance the packing properties of the inside of holes with the resist underlayer film-forming composition at a baking process. Specific examples thereof include phthalic acid derivatives such as dimethyl phthalate, diethyl phthalate, diisobutyl phthalate, dihexyl phthalate, and butylisodecyl phthalate, adipic acid derivatives such as di-n-butyl adipate, diisobutyl adipate, diisooctyl adipate, and octyldecyl adipate, maleic acid derivatives such as di-n-butyl maleate, diethyl maleate, and dinonyl maleate, oleic acid derivatives such as methyl oleate, butyl oleate, and tetrahydrofurfuryl oleate, and stearic acid derivatives such as n-butyl stearate and glyceryl stearate. The rheology controlling agent is usually mixed in an amount of less than 30% by mass, relative to the total solid content of the resist underlayer film-forming composition for lithography.

The adhesive adjuvant is added to mainly improve the adhesion of the substrate or the resist to the resist underlayer film-forming composition, and in particular, to prevent the resist from being peeled in development. Specific examples thereof include chlorosilanes such as trimethylchlorosilane, dimethylvinylchlorosilane, methyldiphenylchlorosilane, and chloromethyldimethylchlorosilane, alkoxysilanes such as trimethylmethoxysilane, dimethyldiethoxysilane, methyldimethoxysilane, dimethylvinylethoxysilane, diphenyldimethoxysilane, and phenyltriethoxysilane, silazanes such as hexamethyldisilazane, N,N'-bis(trimethylsilyl)urea, dimethyltrimethylsilylamine, and trimethylsilyl imidazole, silanes such as vinyltrichlorosilane, γ-chloropropyltrimethoxysilane, γ-aminopropyltriethoxysilane, and γ-glycidoxypropyltrimethoxysilane, heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine, and urea or thiourea compound such as 1,1-dimethylurea and 1,3-dimethylurea. The adhesive adjuvant is usually mixed in an amount of less than 5% by mass, and preferably less than 2% by mass, relative to the total solid content of the resist underlayer film-forming composition for lithography.

In the resist underlayer film-forming composition for lithography of the present invention, the surfactant can be mixed to further improve the coating properties against unevenness of a surface without generation of pinholes and striation. Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkyl allyl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitane tristearate, and fluorosurfactants including Eftop EF301, EF303, and EF352 (trade name, available from Tohkem Products Corporation), MEGAFACE F171, F173, R-40, and R-40N (trade name, available from DIC Corporation), Fluorad FC430 and FC431 (trade name, available from Sumitomo 3M, Ltd.), Asahi Guard AG710, and Surflon S-382, SC101, SC102, SC103, SC104, SC105, and SC106 (trade name, available from Asahi Glass Co., Ltd.), and organosiloxane polymer KP341 (available from Shin-Etsu Chemical Co., Ltd.). The amount of surfactant to be mixed is usually 2.0% by mass or less, and preferably 1.0% by mass or less, relative to the total solid content of the resist underlayer film-forming composition for lithography of the present invention. The surfactant may be added singly or two or more of them may be added in combination.

In the present invention, as a solvent capable of dissolving the polymer, the crosslinker component, the cross-linking catalyst, and the like, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, or butyl lactate can be used. The organic solvent can be used singly, or two or more of them can be used in combination.

Further, a mixture of solvents having a high boiling point such as propylene glycol monobutyl ether and propylene glycol monobutyl ether acetate can be used. Among the solvents, propylene glycol monomethyl ether, propylene glycol monomethyl ether acetate, ethyl lactate, butyl lactate, and cyclohexanone are preferred for improving leveling properties. In particular, propylene glycol monomethyl ether and propylene glycol monomethyl ether acetate are preferred.

The resist underlayer film-forming composition containing the resin used in the present invention exhibits high solubility in the solvent generally used at the lithography process, such as propylene glycol monomethyl ether and propylene glycol monomethyl ether acetate.

A resist used in the present invention is a photoresist or an electron beam resist.

As the photoresist applied to the top of the resist underlayer film for lithography formed from the composition of the present invention, any of a negative photoresist and a positive photoresist can be used. Examples thereof include a positive photoresist including a novolac resin and 1,2-naphthoquinone diazide sulfonic acid ester, a chemically amplified photoresist including a binder having a group that increases an alkali dissolution rate by decomposition with an acid and a photoacid generator, a chemically amplified photoresist including an alkaline soluble binder, a low molecular compound that increases the alkali dissolution rate of the photoresist by decomposition with an acid, and a photoacid generator, a chemically amplified photoresist including a binder having a group that increases the alkali dissolution rate by decomposition with an acid, a low molecular compound that increases the alkali dissolution rate of the photoresist by decomposition with the acid, and a photoacid generator, and a photoresist having a Si atom in the skeleton. Specific examples thereof include trade name APEX-E available from Rohm and Haas.

Examples of the electron beam resist applied to the top of the resist underlayer film for lithography formed from the composition of the present invention include a composition including a resin having a Si—Si bond in the main chain and an aromatic ring at the terminal and an acid generator that generates an acid by irradiation with electron beam, and a composition including poly(p-hydroxylstyrene) in which a hydroxyl group is substituted with an organic group containing N-carboxyamine and an acid generator that generates an acid by irradiation with electron beam. The latter electron beam resist composition exhibits alkaline solubility by reacting an acid generated from the acid generator by irradiation with electron beam with an N-carboxyaminoxy group of a polymer side chain to decompose the polymer side chain into a hydroxyl group, and is dissolved in an alkaline developer to form a resist pattern. Examples of the acid generator that generates an acid by irradiation with electron beam include halogenated organic compounds such as 1,1-bis[p-chlorophenyl]-2,2,2-trichloroethane, 1,1-bis[p-methoxyphenyl]-2,2,2-trichloroethane, 1,1-bis[p-chlorophenyl]-2,2-dichloroethane, and 2-chloro-6-(trichloromethyl) pyridine, onium salts such as a triphenyl sulfonium salt and a diphenyliodonium salt, and sulfonic acid esters such as nitrobenzyl tosylate and dinitrobenzyl tosylate.

As a developer of a resist having a resist underlayer film formed from the resist underlayer film-forming composition for lithography of the present invention, an aqueous solution of alkali including an inorganic alkali such as sodium hydroxide, potassium hydroxide, sodium carbonate, sodium silicate, sodium metasilicate, and aqueous ammonia, a primary amine such as ethylamine and n-propylamine, a secondary amine such as diethylamine and di-n-butylamine, a tertiary amine such as triethylamine and methyldiethylamine, an alcoholamine such as dimethylethanolamine and triethanolamine, a quaternary ammonium salt such as tetramethylammonium hydroxide, tetraethylammonium hydroxide, and choline, and a cyclic amine such as pyrrole and piperidine can be used. A solution in which proper amounts of an alcohol such as isopropyl alcohol and a surfactant such as a nonionic surfactant are added to the aqueous solution of the alkali can be used. Among the developers, a quaternary ammonium salt is preferred, and tetramethylammonium hydroxide and choline are further preferred.

As the developer, an organic solvent can be used. Examples thereof include methyl acetate, butyl acetate, ethyl acetate, isopropyl acetate, amyl acetate, isoamyl acetate, ethyl methoxyacetate, ethyl ethoxyacetate, 2-heptanone, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl 3-methoxypropionate, ethyl 3-methoxypropionate, ethyl 3-ethoxypropionate, and propyl 3-methoxypropionate. As the developer, butyl acetate, 2-heptanone, or the like can be preferably used.

Further, a surfactant or the like may be added to the developer. A development condition is appropriately selected from a development temperature of 5 to 50° C. and a development time of 10 to 600 seconds.

Next, the method for forming a resist pattern of the present invention will be described. The resist underlayer film-forming composition is applied to a substrate used in production of a precision integrated circuit element (e.g., a transparent substrate such as a silicon/silicon dioxide coating, a glass substrate, and an ITO substrate) with an appropriate coating method such as a spinner and a coater, and then is baked and cured to form a coating-type underlayer film. The thickness of the resist underlayer film is preferably 0.01 to 3.0 µm. A baking (curing) condition after the coating is at 80 to 400° C. for 0.5 to 120 minutes. After then, the resist is applied directly to the resist underlayer film, or if necessary, the resist is applied after one or more layers of coating material are formed on the coating-type underlayer film. The resist is irradiated with light or electron beam through a predetermined mask, developed, rinsed, and dried. Thus, a good resist pattern can be obtained. If necessary, post exposure bake (PEB) can also be carried out after irradiation with light or electron beam. The resist underlayer film at an area where the resist is developed and removed at the above-described step can be removed by dry etching, to form a desired pattern on the substrate.

The exposure light of the photoresist is actinic radiation such as near ultraviolet light, far ultraviolet light, and extreme ultraviolet light (e.g., EUV, wavelength: 13.5 nm). For example, light having a wavelength of 248 nm (KrF laser beam), 193 nm (ArF laser beam), or 157 nm ($F_2$ laser beam) can be used. A method for light irradiation can be adopted without particular restriction as long as it is a method capable of generating an acid from the photoacid generator. The exposure dose is 1 to 2,000 $mJ/cm^2$, 10 to 1,500 $mJ/cm^2$, or 50 to 1,000 $mJ/cm^2$.

In irradiation of the electron beam resist with electron beam, for example, irradiation can be carried out using an electron beam irradiating device.

In the present invention, a semiconductor device can be produced through steps of forming a resist underlayer film on a semiconductor substrate from the resist underlayer film-forming composition, forming a resist film on the resist underlayer film, forming a resist pattern by irradiation with light or electron beam and development, etching the resist underlayer film through the formed resist pattern, and processing the semiconductor substrate through the patterned resist underlayer film.

When miniaturization of the resist pattern further advances, a problem of resolution and a problem in which the resist pattern collapses after development occur. For this reason, a decrease in film thickness of a resist is desired. In this case, it is difficult to obtain a resist pattern film thickness sufficient for substrate processing. A process that imparts a function of a mask during substrate processing not only to the resist pattern but also to a resist underlayer film that is formed between the resist and the semiconductor substrate to be processed is required. As a resist underlayer film for such processing, which is different from a conventional resist underlayer film having a high etching rate, a resist underlayer film for lithography having a selection ratio of dry etching rate close to that of the resist, a resist underlayer film for lithography having a smaller selection ratio of dry etching rate than that of the resist, and a resist underlayer film for lithography having a smaller selection ratio of dry etching rate than that of the semiconductor substrate are required. To such a resist underlayer film, an anti-reflective performance may be imparted, and the resist underlayer film may have a function of a conventional anti-reflective coating.

On the other hand, in order to obtain finer resist pattern, a process in which the resist pattern and the resist underlayer film are made finer than the pattern width during resist development in dry etching of the resist underlayer film starts to be also used. A resist underlayer film having a selection ratio of dry etching close to that of the resist, which is different from the conventional anti-reflective coating having a high etching rate is required as the resist underlayer film for such a process. To such a resist underlayer film, the anti-reflective performance may be imparted, and the resist underlayer film may have a function of the conventional anti-reflective coating.

The resist underlayer film-forming composition of the present invention is effective in a lithography process in which at least two layers of resist underlayer film are formed for a decrease in film thickness of the resist film and the resist underlayer film is used as an etching mask. The resist underlayer film-forming composition has high dry etching resistance against an etching gas such as fluorocarbon. In addition, the resist underlayer film-forming composition has sufficient etching resistance against a processing substrate (e.g., thermal silicon oxide film, silicon nitride film, and poly-silicon film) when the substrate is processed using the resist underlayer film of the present invention.

Therefore, in the present invention, after the resist underlayer film of the present invention is formed on the substrate, the resist may be applied directly to the resist underlayer film. Alternatively, if necessary, after one or more layers of coating material are formed on the resist underlayer film, the resist may be applied. In this case, even when the pattern width of the resist decreases and the resist is thinly applied to prevent pattern collapse, the substrate can be processed by selecting appropriate etching gas.

Specifically, the semiconductor device can be produced through steps of forming a resist underlayer film on a semiconductor substrate from the resist underlayer film-forming composition, forming a hard mask from a coating material containing a silicon component or the like or a hard mask (e.g., from silicon nitride oxide) by vapor deposition on the resist underlayer film, forming a resist film on the hard mask, forming a resist pattern by irradiation with light or electron beam and development, etching the hard mask through the resist pattern by halogen-based gas, etching the resist underlayer film through the patterned hard mask by oxygen-based gas or hydrogen-based gas, and processing the semiconductor substrate through the patterned resist underlayer film by halogen-based gas.

In consideration of effects as the anti-reflective coating, a light absorption moiety is incorporated in the skeleton of the resist underlayer film-forming composition for lithography of the present invention. Therefore, a substance is not diffused in the photoresist during heating and drying. In addition, the light absorption moiety has sufficiently large light absorption performance, so the resist underlayer film-forming composition has a high reflective light prevention effect.

The resist underlayer film-forming composition for lithography of the present invention has high thermal stability, and can prevent pollution of a top layer due to a decomposed substance during baking, and impart a margin of temperature at the baking step.

Further, the resist underlayer film-forming composition for lithography of the present invention can be used for a film having a function of preventing reflection of light depending on a process condition, and a function of preventing an interaction between the substrate and the photoresist or an adverse effect on the substrate of a substance produced during exposure of the photoresist or a material used for the photoresist.

EXAMPLES

Example 1

5.75 g of propylene glycol monomethyl ether and 22.98 g of propylene glycol monomethyl ether acetate were added to 7.55 g of 2-phenylindole, 9.00 g of 1-pyrenecarboxyaldehyde, 2.04 g of styrene, and 0.56 g of methanesulfonic acid, and the mixture was stirred at 130° C. for 24 hours in a nitrogen atmosphere. The reaction liquid was added dropwise to methanol, and the deposited resin was filtered out, washed, and dried under reduced pressure at 70° C. to obtain 15.61 g of resin containing a structure of Formula (4-1). The weight average molecular weight in terms of standard polystyrene measured by GPC of the resin was 1,100.

Subsequently, 1.00 g of the obtained resin and 0.002 g of surfactant (available from DIC Corporation, trade name: MEGAFACE [product name] R-40, fluorosurfactant) were dissolved in 5.70 g of propylene glycol momomethyl ether and 13.30 g of propylene glycol monomethyl ether acetate to prepare a resist underlayer film-forming composition.

Example 2

5.37 g of propylene glycol monomethyl ether and 21.47 g of propylene glycol monomethyl ether acetate were added to 6.71 g of 2-phenylindole, 8.00 g of 1-pyrenecarboxyaldehyde, 2.68 g of 2-vinylnaphthalene, and 0.50 g of methanesulfonic acid, and the mixture was stirred at 130° C. for 24 hours in a nitrogen atmosphere. The reaction liquid was added dropwise to methanol, and the deposited resin was filtered out, washed, and dried under reduced pressure at 70° C. to obtain 16.42 g of resin containing a structure of Formula (4-2). The weight average molecular weight in terms of standard polystyrene measured by GPC of the resin was 1,100.

Subsequently, 1.00 g of the obtained resin and 0.002 g of surfactant (available from DIC Corporation, trade name: MEGAFACE [product name] R-40, fluorosurfactant) were dissolved in 5.70 g of propylene glycol momomethyl ether and 13.30 g of propylene glycol monomethyl ether acetate to prepare a resist underlayer film-forming composition.

Example 3

6.07 g of propylene glycol monomethyl ether and 24.30 g of propylene glycol monomethyl ether acetate were added to 7.55 g of 2-phenylindole, 9.00 g of 1-pyrenecarboxyaldehyde, 3.13 g of 4-tert-butylstyrene, and 0.56 g of methanesulfonic acid, and the mixture was stirred at 130° C. for 24 hours in a nitrogen atmosphere. The reaction liquid was added dropwise to methanol, and the deposited resin was filtered out, washed, and dried under reduced pressure at 70° C. to obtain 17.60 g of resin containing a structure of Formula (4-3). The weight average molecular weight in terms of standard polystyrene measured by GPC of the resin was 1,400.

Subsequently, 1.00 g of the obtained resin and 0.002 g of surfactant (available from DIC Corporation, trade name: MEGAFACE [product name] R-40, fluorosurfactant) were dissolved in 5.70 g of propylene glycol momomethyl ether and 13.30 g of propylene glycol monomethyl ether acetate to prepare a resist underlayer film-forming composition.

Example 4

37.18 g of propylene glycol monomethyl ether was added to 9.23 g of 2-phenylindole, 11.00 g of 1-pyrenecarboxyaldehyde, 4.21 g of 4-tert-butoxystyrene, and 0.34 g of methanesulfonic acid, and the mixture was stirred with reflux for 24 hours in a nitrogen atmosphere. The reaction liquid was added dropwise to methanol, and the deposited resin was filtered out, washed, and dried under reduced pressure at 70° C. to obtain 15.20 g of resin containing a structure of Formula (4-4). The weight average molecular weight in terms of standard polystyrene measured by GPC of the resin was 1,200.

Subsequently, 1.00 g of the obtained resin and 0.002 g of surfactant (available from DIC Corporation, trade name: MEGAFACE [product name] R-40, fluorosurfactant) were dissolved in 5.70 g of propylene glycol momomethyl ether and 13.30 g of propylene glycol monomethyl ether acetate to prepare a resist underlayer film-forming composition.

Example 5

39.05 g of propylene glycol monomethyl ether was added to 10.00 g of phenyl-1-naphthylamine, 7.12 g of 1-naphthaldehyde, 8.04 g of 4-tert-butoxystyrene, and 0.88 g of methanesulfonic acid, and the mixture was stirred with reflux for 17 hours in a nitrogen atmosphere. The reaction liquid was added dropwise to methanol, and the deposited resin was filtered out, washed, and dried under reduced pressure at 70° C. to obtain 13.52 g of resin containing a structure of Formula (4-5). The weight average molecular weight in terms of standard polystyrene measured by GPC of the resin was 3,400.

Subsequently, 1.00 g of the obtained resin and 0.002 g of surfactant (available from DIC Corporation, trade name: MEGAFACE [product name] R-40, fluorosurfactant) were dissolved in 5.70 g of propylene glycol momomethyl ether and 13.30 g of propylene glycol monomethyl ether acetate to prepare a resist underlayer film-forming composition.

Example 6

22.06 g of 1,4-dioxane and 22.06 g of toluene were added to 10.00 g of phenyl-1-naphthylamine, 10.50 g of 1-pyrenecarboxyaldehyde, 8.04 g of 4-tert-butoxystyrene, and 0.88 g of methanesulfonic acid, and the mixture was stirred with reflux for 17 hours in a nitrogen atmosphere. The reaction liquid was added dropwise to methanol, and the deposited resin was filtered out, washed, and dried under reduced pressure at 70° C. to obtain 11.44 g of resin containing a structure of Formula (4-6). The weight average molecular weight in terms of standard polystyrene measured by GPC of the resin was 1,400.

Subsequently, 1.00 g of the obtained resin and 0.002 g of surfactant (available from DIC Corporation, trade name: MEGAFACE [product name] R-40, fluorosurfactant) were dissolved in 13.30 g of propylene glycol momomethyl ether and 5.70 g of propylene glycol monomethyl ether acetate to prepare a resist underlayer film-forming composition.

Example 7

6.48 g of propylene glycol monomethyl ether and 25.90 g of propylene glycol monomethyl ether acetate were added to 8.39 g of 2-phenylindole, 10.00 g of 1-pyrenecarboxyaldehyde, 2.57 g of α-methylstyrene, and 0.63 g of methanesulfonic acid, and the mixture was stirred with reflux for 24 hours in a nitrogen atmosphere. The reaction liquid was added dropwise to methanol, and the deposited resin was filtered out, washed, and dried under reduced pressure at 70° C. to obtain 15.30 g of resin containing a structure of Formula (4-7). The weight average molecular weight in terms of standard polystyrene measured by GPC of the resin was 600.

Subsequently, 1.00 g of the obtained resin and 0.002 g of surfactant (available from DIC Corporation, trade name: MEGAFACE [product name] R-40, fluorosurfactant) were dissolved in 5.70 g of propylene glycol momomethyl ether and 13.30 g of propylene glycol monomethyl ether acetate to prepare a resist underlayer film-forming composition.

Example 8

6.19 g of propylene glycol monomethyl ether and 24.77 g of propylene glycol monomethyl ether acetate were added to 7.55 g of 2-phenylindole, 9.00 g of 1-pyrenecarboxyaldehyde, 3.52 g of 1,1-diphenylethylene, and 0.56 g of methanesulfonic acid, and the mixture was stirred with reflux for 24 hours in a nitrogen atmosphere. The reaction liquid was added dropwise to methanol, and the deposited resin was filtered out, washed, and dried under reduced pressure at 70° C. to obtain 16.22 g of resin containing a structure of Formula (4-8). The weight average molecular weight in terms of standard polystyrene measured by GPC of the resin was 800.

Subsequently, 1.00 g of the obtained resin and 0.002 g of surfactant (available from DIC Corporation, trade name: MEGAFACE [product name] R-40, fluorosurfactant) were dissolved in 5.70 g of propylene glycol momomethyl ether and 13.30 g of propylene glycol monomethyl ether acetate to prepare a resist underlayer film-forming composition.

Comparative Example 1

5.64 g of propylene glycol monomethyl ether and 22.57 g of propylene glycol monomethyl ether acetate were added to 8.39 g of 2-phenylindole, 10.00 g of 1-pyrenecarboxyaldehyde, and 0.42 g of methanesulfonic acid, and the mixture was stirred at 130° C. for 24 hours in a nitrogen atmosphere. The reaction liquid was added dropwise to methanol, and the deposited resin was filtered out, washed, and dried under reduced pressure at 70° C. to obtain 15.10 g of resin containing a structure of the following Formula (8-1). The weight average molecular weight in terms of standard polystyrene measured by GPC of the resin was 1,200.

Subsequently, 1.00 g of the obtained resin and 0.002 g of surfactant (available from DIC Corporation, trade name: MEGAFACE [product name] R-40, fluorosurfactant) were dissolved in 5.70 g of propylene glycol momomethyl ether and 13.30 g of cyclohexanone to prepare a resist underlayer film-forming composition.

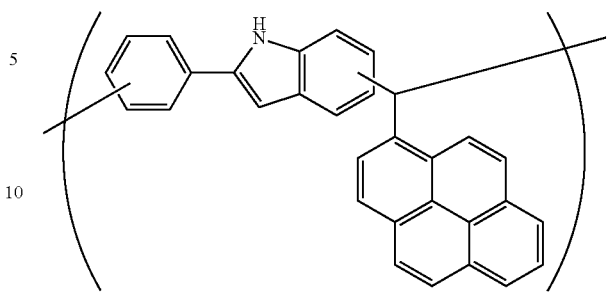

Formula (8-1)

Comparative Example 2

17.12 g of 1,4-dioxane and 17.12 g of toluene were added to 13.00 g of phenyl-1-naphthylamine, 9.26 g of 1-naphthaldehyde, and 0.57 g of methanesulfonic acid, and the mixture was stirred with reflux for 17 hours in a nitrogen atmosphere. The reaction liquid was added dropwise to methanol, and the deposited resin was filtered out, washed, and dried under reduced pressure at 70° C. to obtain 20.40 g of resin containing a structure of the following Formula (8-2). The weight average molecular weight in terms of standard polystyrene measured by GPC of the resin was 1,400.

Subsequently, 1.00 g of the obtained resin and 0.002 g of surfactant (available from DIC Corporation, trade name: MEGAFACE [product name] R-40, fluorosurfactant) were dissolved in 5.70 g of propylene glycol momomethyl ether and 13.30 g of propylene glycol monomethyl ether acetate to prepare a resist underlayer film-forming composition.

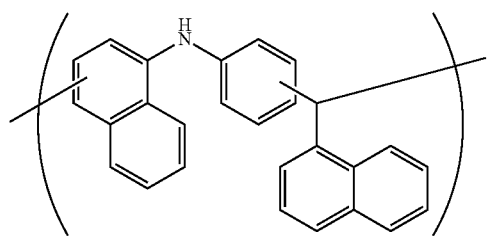

Formula (8-2)

Comparative Example 3

17.27 g of 1,4-dioxane and 17.27 g of toluene were added to 11.00 g of phenyl-1-naphthylamine, 11.55 g of 1-pyrenecarboxyaldehyde, and 0.48 g of methanesulfonic acid, and the mixture was stirred with reflux for 16 hours in a nitrogen atmosphere. The reaction liquid was added dropwise to methanol, and the deposited resin was filtered out, washed, and dried under reduced pressure at 70° C. to obtain 19.88 g of resin containing a structure of the following Formula (8-3). The weight average molecular weight in terms of standard polystyrene measured by GPC of the resin was 900.

Subsequently, 1.00 g of the obtained resin and 0.002 g of surfactant (available from DIC Corporation, trade name: MEGAFACE [product name] R-40, fluorosurfactant) were dissolved in 5.70 g of propylene glycol momomethyl ether and 13.30 g of cyclohexanone to prepare a resist underlayer film-forming composition.

Formula (8-3)

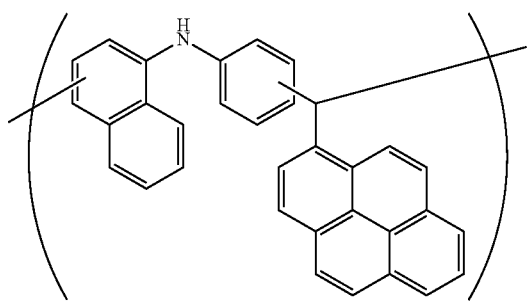

Comparative Example 4

6.41 g of propylene glycol monomethyl ether and 25.63 g of propylene glycol monomethyl ether acetate were added to 11.00 g of 1-methyl-2-phenylindole, 9.90 g of 1-pyrenecarboxyaldehyde, and 0.46 g of methanesulfonic acid, and the mixture was stirred with reflux for 24 hours in a nitrogen atmosphere. The reaction liquid was added dropwise to methanol, and the deposited resin was filtered out, washed, and dried under reduced pressure at 70° C. to obtain 20.24 g of resin containing a structure of the following Formula (8-4). The weight average molecular weight in terms of standard polystyrene measured by GPC of the resin was 1,000.

Subsequently, 1.00 g of the obtained resin and 0.002 g of surfactant (available from DIC Corporation, trade name: MEGAFACE [product name] R-40, fluorosurfactant) were dissolved in 5.70 g of propylene glycol momomethyl ether and 13.30 g of cyclohexanone to prepare a resist underlayer film-forming composition.

Formula (8-4)

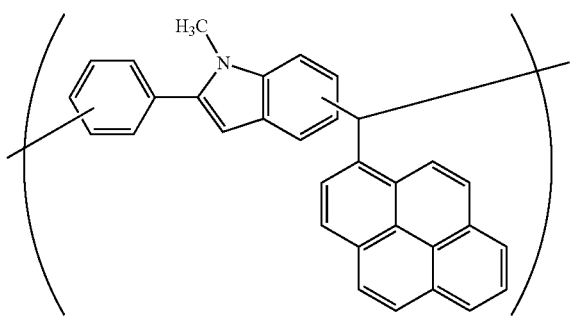

(Solubility Test)

A 30% by mass solution of each of the resins obtained in Examples 1 to 8 and Comparative Examples 1 to 4 in propylene glycol monomethyl ether (PGME) and propylene glycol monomethyl ether acetate (PGMEA), which are typical resist solvents, was prepared. At that time, a case where a resin is dissolved to obtain a homogeneous solution is judged as "good" solubility, and a case where a resist is not sufficiently dissolved to obtain a suspension is judged as "poor" solubility. The results of the solubility test of the resins are shown in Table 1.

TABLE 1

| Solubility Test of Resin | | |
|---|---|---|
| Resin | PGME | PGMEA |
| Example 1 | Good | Good |
| Example 2 | Good | Good |
| Example 3 | Good | Good |
| Example 4 | Good | Good |
| Example 5 | Good | Good |
| Example 6 | Good | Good |
| Example 7 | Good | Good |
| Example 8 | Good | Good |
| Comparative Example 1 | Poor | Poor |
| Comparative Example 2 | Poor | Good |
| Comparative Example 3 | Poor | Poor |
| Comparative Example 4 | Poor | Poor |

As confirmed from the results of Table 1, the resins of Examples 1 to 8 exhibit higher solubility in PGME and PGMEA, which are typical resist solvents, than those of Comparative Examples 1 to 4.

(Sublimate Measurement Test)

The amount of sublimate was measured using a sublimate amount measurement device described in International publication WO2007/111147 Pamphlet. The resist underlayer film-forming composition prepared in each of Examples 1 to 6 and Comparative Examples 1 to 4 was applied to a silicon wafer substrate having a diameter of 4 inches using a spin coater such that the thickness was 50 nm. The wafer having the resist underlayer film was set in the sublimate amount measurement device integrated with a hot plate, and baked for 120 seconds, and the sublimate was collected by a quartz crystal microbalance (QCM) sensor, that was, a quartz crystal unit having an electrode. The QCM sensor can measure slight mass change using properties in which the frequency of the quartz crystal unit is changed (decreased) depending on the mass of the sublimate that is attached to a surface (electrode) of the quartz crystal unit.

A detailed measurement protocol is as follows. The temperature of the hot plate of the sublimate amount measurement device was set to 300° C., the pump flow rate was set to 1 m³/s, and the device was left for first one 60 seconds to stabilize the device. Immediately after that, the wafer covered with the resist underlayer film was placed on the hot plate rapidly from a slide outlet, and the sublimate was collected from a time point of 60 seconds to a time point of 120 seconds (for 60 seconds). The QCM sensor in which a material (AlSi) having silicon and aluminum as main components was used as the electrode, the diameter of the quartz crystal unit (sensor diameter) was 14 mm, the diameter of electrode on the surface of the quartz crystal unit was 5 mm, and the resonant frequency was 9 MHz was used.

The obtained frequency change of eigenvalue of the quartz crystal unit used in the measurement was converted into grams, and the sublimate amount of one wafer having the resist underlayer film was calculated. The sublimate amount of the resist underlayer film determined by the device is shown in Tables 1 to 3 as a sublimate amount ratio. The sublimate amount ratio is a value standardized on the basis of the amount of sublimate generated from the resist underlayer film of each of Comparative Examples 1 to 3 as 1.

TABLE 2

Amount of Sublimate generated from Resist Underlayer Film

| Resist underlayer film | Sublimate Amount Ratio |
|---|---|
| Example 1 | 0.75 |
| Example 2 | 0.58 |
| Example 3 | 0.69 |
| Example 4 | 0.62 |
| Comparative Example 1 | 1.00 |
| Comparative Example 4 | 1.71 |

TABLE 3

Amount of Sublimate generated from Resist Underlayer Film

| Resist underlayer film | Sublimate Amount Ratio |
|---|---|
| Example 5 | 0.34 |
| Comparative Example 2 | 1.00 |

TABLE 4

Amount of Sublimate generated from Resist Underlayer Film

| Resist underlayer film | Sublimate Amount Ratio |
|---|---|
| Example 6 | 0.20 |
| Comparative Example 3 | 1.00 |

From the results of Table 2, the amounts of sublimates generated from the resist underlayer film-forming compositions of Examples 1 to 4 are smaller than the amounts of sublimates generated from the resist underlayer film-forming compositions of Comparative Examples 1 and 4. Similarly, from Table 3, the amount of sublimate generated from the resist underlayer film-forming compositions of Example 5 is smaller than the amount of sublimate generated from the resist underlayer film-forming composition of Comparative Example 2. From Table 4, the amount of sublimate generated from the resist underlayer film-forming compositions of Example 6 is smaller than the amount of sublimate generated from the resist underlayer film-forming composition of Comparative Example 3. Specifically, it is shown that the resist underlayer film-forming compositions of Examples 1 to 6 can effectively suppress the generation of sublimate.

In the present invention, the structure group (C) formed by a reaction of the compound of Formula (1) has an alkyl group produced from a vinyl group. The structure group (C) having this structure is considered to improve the solubility in the solvent.

On the other hand, in Comparative Example 4 in which the structure group (C) was not formed and the resin having a structure in which an alkyl group was bonded to a polymer main chain was used, the solubility is not improved.

INDUSTRIAL APPLICABILITY

Accordingly, the resist underlayer film-forming composition of the present invention used in a lithography process using a multilayer film has not only high dry etching resistance and anti-reflective coating function, but also excellent spin coating properties because of high solubility in a resist solvent (solvent used in a lithography step). Intermixing (mixing of layers) between the obtained resist underlayer film and a top coating resist does not occur. The resist underlayer film-forming composition can suppress the generation of sublimating component at the baking step.

The invention claimed is:

1. A resist underlayer film-forming composition comprising
   a novolac resin, and
   a solvent selected from the group consisting of propylene glycol monomethyl ether, propylene glycol monomethyl ether acetate and mixtures thereof,
   wherein the novolac resin has a structure group (C) as an additional group that is obtained by addition reaction of an aromatic ring structure of an aromatic ring-containing compound (A) with a vinyl group of an aromatic vinyl compound (B) having one vinyl group in the molecule in the presence of an aldehyde,
   wherein the aromatic ring-containing compound (A) and the aromatic vinyl compound (B) are reacted at a molar ratio (A):(B) of 1:0.1 to 8.0,
   wherein the aromatic ring-containing compound (A) is an aromatic amine compound selected from the group consisting of phenylindole and phenylnaphthylamine,
   wherein the structure group (C) is represented by Formula (2):

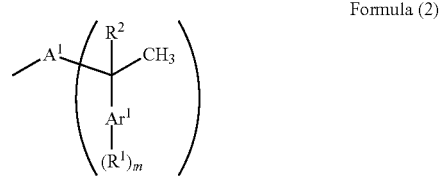

Formula (2)

wherein in Formula (2), $Ar^1$, $R^1$ and $R^2$ are each a group derived from the aromatic vinyl compound (B), wherein $Ar^1$ is a phenyl group, $R^1$ is a hydroxyl group, $R^2$ is a hydrogen atom, a methyl group, or a phenyl group, and m is 1 $Ar^1$ is a phenyl group, $R^1$ is a hydroxyl group, $R^2$ is a hydrogen atom, a methyl group, or a phenyl group, and m is 1, and $A^1$ is a group derived from the aromatic ring structure of the aromatic ring-containing compound (A), and
   wherein the aldehyde is naphthaldehyde or pyrenecarboxyaldehyde.

2. The resist underlayer film-forming composition according to claim 1, wherein the aromatic ring structure of the aromatic ring-containing compound (A) is an aromatic ring-containing structure constituting a polymer chain of the novolac resin.

3. The resist underlayer film-forming composition according to claim 1, further comprising an acid and/or an acid generator.

4. The resist underlayer film-forming composition according to claim 1, further comprising a crosslinker.

5. The resist underlayer film-forming composition according to claim 1, wherein the novolac resin has one of the following Formulas:

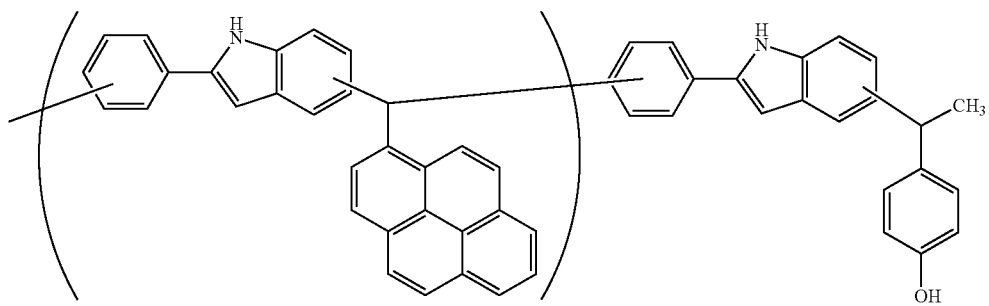

Formula (4-4)

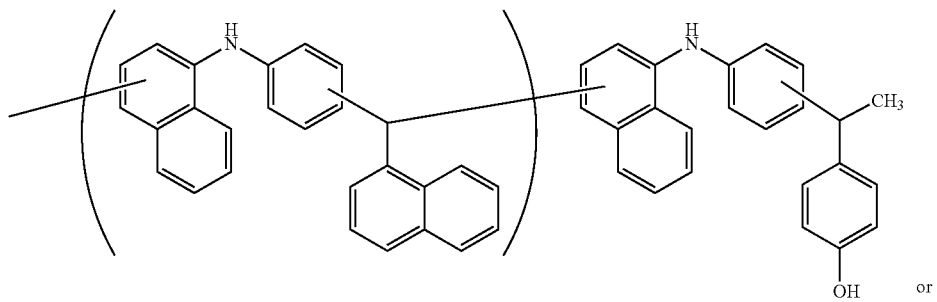

Formula (4-5)

or

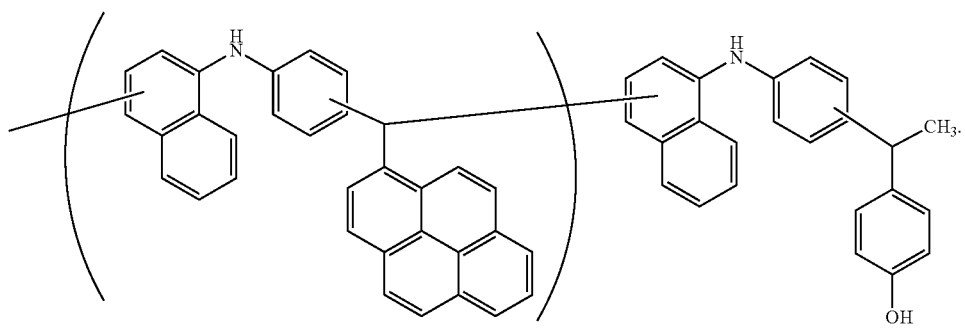

Formula (4-6)

6. A method for forming a resist pattern used in production of a semiconductor comprising a step of applying the resist underlayer film-forming composition according to claim 1 to a semiconductor substrate and baking the composition to form an underlayer film.

7. A method for producing a semiconductor device comprising steps of forming an underlayer film on a semiconductor substrate from the resist underlayer film-forming composition according to claim 1, forming a resist film on the underlayer film, forming a resist pattern by irradiation with light or electron beam and development, etching the underlayer film through the formed resist pattern, and processing the semiconductor substrate through the patterned underlayer film.

8. A method for producing a semiconductor device comprising steps of forming an underlayer film on a semiconductor substrate from the resist underlayer film-forming composition according to claim 1, forming a hard mask on the underlayer film, forming a resist film on the hard mask, forming a resist pattern by irradiation with light or electron beam and development, etching the hard mask through the formed resist pattern, etching the underlayer film through the patterned hard mask, and processing the semiconductor substrate through the patterned underlayer film.

9. The method according to claim 8, wherein the hard mask is formed by vapor deposition of an inorganic substance.

10. A resist underlayer film-forming composition comprising a novolac resin having a structure group (C) as an additional group that is obtained by a reaction of an aromatic ring structure of an aromatic ring-containing compound (A) with a vinyl group of an aromatic vinyl compound (B) in the presence of an aldehyde, and a solvent selected form the group consisting of propylene glycol monomethyl ether, propylene glycol monomethyl ether acetate and mixtures thereof, wherein the aromatic ring-containing compound (A) is an aromatic amine compound selected from the group consisting of phenylindole and phenylnaphthylamine, wherein the aromatic vinyl compound (B) is styrene, 2-vinylnaphthalene, 4-tert-butylstyrene, or 4-tert-butoxystyrene, wherein the aldehyde is naphthaldehyde or pyrenecarboxyaldehyde, wherein the aromatic ring-containing compound (A) and the aromatic vinyl compound (B) are reacted at a molar ratio (A):(B) of 1:0.1 to 8.0, wherein the novolac resin is a resin produced by a reaction of the aromatic amine compound with the aldehyde, and wherein the structure group (C) is represented by Formula (2):

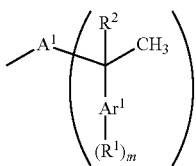

Formula (2)

wherein in Formula (2), Ar¹, R¹ and R² are each a group derived from the aromatic vinyl compound (B), wherein Ar¹ is a phenyl group or a napththyl group, R¹ is hydrogen, tert-butyl or tert-butoxy, m is 1 and R² is a hydrogen atom, and A¹ is a group derived from the aromatic ring structure of the aromatic ring-containing compound (A).

11. A resist underlayer film-forming composition comprising
a novolac resin, and
wherein the novolac resin has a structure group (C) as an additional group that is obtained by addition reaction of an aromatic ring structure of an aromatic ring-containing compound (A) with a vinyl group of an aromatic vinyl compound (B) having one vinyl group in the molecule in the presence of an aldehyde,
wherein the aromatic ring-containing compound (A) and the aromatic vinyl compound (B) are reacted at a molar ratio (A):(B) of 1:0.1 to 8.0,
wherein the aromatic ring-containing compound (A) is an aromatic amine compound selected from the group consisting of phenylindole and phenylnaphthylamine,
wherein the structure group (C) is represented by Formula (2):

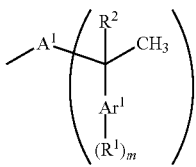

Formula (2)

wherein in Formula (2), Ar¹, R¹ and R² are each a group derived from the aromatic vinyl compound (B), wherein Ar¹ is a phenyl group, R¹ is a hydroxyl group, R² is a phenyl group, and m is 1, and A¹ is a group derived from the aromatic ring structure of the aromatic ring-containing compound (A).

12. A resist underlayer film-forming composition comprising a novolac resin having a structure group (C) as an additional group that is obtained by addition reaction of an aromatic ring structure of an aromatic ring-containing compound (A) with a vinyl group of an aromatic vinyl compound (B) having one vinyl group in the molecule,
wherein the aromatic ring-containing compound (A) and the aromatic vinyl compound (B) are reacted at a molar ratio (A):(B) of 1:0.1 to 8.0,
wherein the aromatic ring-containing compound (A) is an aromatic amine compound selected from the group consisting of phenylindole and phenylnaphthylamine,
wherein the structure group (C) is represented by Formula (2):

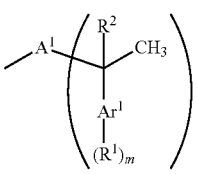

Formula (2)

wherein in Formula (2), Ar¹, R¹ and R² are each a group derived from the aromatic vinyl compound (B), wherein Ar¹ is a $C_{6-40}$ aryl group, R¹ is a $C_{1-10}$ alkyl group, a $C_{6-40}$ aryl group, a hydroxyl group, a cyano group, a nitro group, an amino group, a carboxyl group, an acetyl group, a hydroxymethyl group, a halogenomethyl group, a —Y—Z group, a halogen atom, or a combination of these, Y is an oxygen atom, a sulfur atom, a carbonyl group, or an ester group, Z is a $C_{1-10}$ alkyl group, R² is a phenyl group, and m is an integer of 0 to (5+2n), wherein n is the condensation degree of an aromatic ring constituting the aryl group as defined by Ar¹, and A¹ is a group derived from the aromatic ring structure of the aromatic ring-containing compound (A).

* * * * *